(12) United States Patent
Martens et al.

(10) Patent No.: US 9,312,226 B2
(45) Date of Patent: Apr. 12, 2016

(54) SEMICONDUCTOR DEVICE HAVING AN IDENTIFICATION MARK

(71) Applicant: Infineon Technologies AG, Neubiberg (DE)

(72) Inventors: Stefan Martens, Munich (DE); Berthold Schuderer, Regensburg (DE); Mathias Vaupel, Regensburg (DE); Raimund Peichl, Hohenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/716,004

(22) Filed: Dec. 14, 2012

(65) Prior Publication Data

US 2014/0167272 A1   Jun. 19, 2014

(51) Int. Cl.
*H01L 23/485* (2006.01)
*H01L 23/544* (2006.01)
*H01L 23/31* (2006.01)

(52) U.S. Cl.
CPC .......... *H01L 23/544* (2013.01); *H01L 23/3171* (2013.01); *H01L 2223/5442* (2013.01); *H01L 2223/54406* (2013.01); *H01L 2223/54413* (2013.01); *H01L 2223/54433* (2013.01); *H01L 2223/54486* (2013.01); *H01L 2924/0002* (2013.01)

(58) Field of Classification Search
CPC ......... H01L 24/05; H01L 24/04; H01L 24/28; H01L 24/29; H01L 23/544; H01L 2223/54406; H01L 2223/54413; H01L 2223/5442; H01L 2223/54433; H01L 2223/54473; H01L 2223/5448
See application file for complete search history.

(56) References Cited

U.S. PATENT DOCUMENTS

2009/0065907 A1 *   3/2009   Haba et al. ................... 257/621
2012/0146093 A1 *   6/2012   Shibata et al. ............... 257/192

FOREIGN PATENT DOCUMENTS

| CN | 101802990 A | 8/2010 |
| JP | 6184824 A | 4/1986 |
| JP | 11135391 A | 5/1999 |
| JP | 3019822 B2 * | 3/2000 |

OTHER PUBLICATIONS

Garrou, Philip. Wafer Level Chip Scale Packaging (WL-CSP): An Overview. May 2000. IEEE Transactions on Advanced Packaging, vol. 23, No. 2, p. 198.*

* cited by examiner

*Primary Examiner* — Robert Bachner
*Assistant Examiner* — Molly Reida
(74) *Attorney, Agent, or Firm* — Slater & Matsil, L.L.P.

(57) ABSTRACT

A semiconductor device includes a chip, a contact pad arranged over the front side of the chip and an identification mark arranged over the contact pad. The identification mark includes an information about a property of the chip.

17 Claims, 3 Drawing Sheets

SEMICONDUCTOR DEVICE HAVING AN IDENTIFICATION MARK

TECHNICAL FIELD

The invention relates to semiconductor devices having an identification mark. The invention further relates to methods for manufacturing such semiconductor devices.

BACKGROUND

During or after the production of a semiconductor device, it may be necessary to identify a property of the semiconductor device or a component included therein. For this purpose identification marks may be used. Semiconductor devices having an identification mark and methods for manufacturing such semiconductor devices constantly have to be improved. In particular, it may be desirable to improve the quality of the semiconductor devices and to decrease costs for manufacturing the semiconductor devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION OF ILLUSTRATIVE EMBODIMENTS

Figure 1:
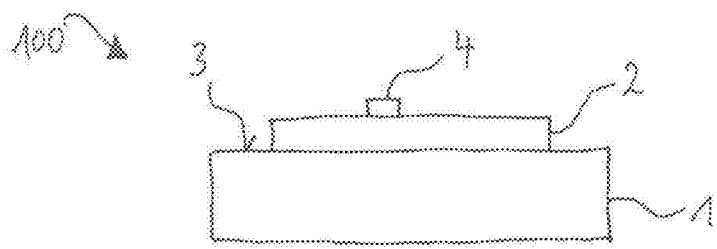
FIG. 1 schematically illustrates a cross-sectional view of a semiconductor device 100 in accordance with the disclosure.

In the following detailed description, reference is made to the accompanying drawings, which form a part hereof, and in which is shown by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

It is understood that the features of the various exemplary aspects described herein may be combined with each other, unless specifically noted otherwise.

As employed in this specification, the terms "coupled" and/or "electrically coupled" are not meant to mean that the elements must be directly coupled together. Intervening elements may be provided between the "coupled" or "electrically coupled" elements.

The semiconductor devices described herein may include one or more chips that may at least partly be manufactured from semiconductor material. The chips need not be manufactured from specific semiconductor material, for example, Si, SiC, SiGe, GaAs, and, furthermore, may contain inorganic and/or organic materials that are not semiconductors, such as, for example, insulators, plastics or metals. The chips may be of different type, may be manufactured by different technologies and may include integrated circuits containing passive electronic components and/or active electronic components. The integrated circuits may be designed as logic integrated circuits, analog integrated circuits, mixed signal integrated circuits, power integrated circuits, memory circuits, integrated passives, etc.

The term "front side" of a chip may be used herein. The term "front side" may particularly relate to a main face of the chip that may include microelectronic components and integrated circuits. Chips may be manufactured from (semiconductor) wafers that may serve as a substrate for microelectronic devices to be built in and over the wafer. The integrated circuits may be manufactured by doping, ion implantation, deposition of materials, photolithographic patterning, etc. The manufacturing processes usually may be performed on a specific main surface of the wafer which may also be referred to as the "front side" of the wafer. After separating the individual chips from the wafer, the "front side" of the wafer consequently becomes the "front side" of the separated chips. Contrarily, the term "back side" of a chip may refer to a main surface of the chip that may be arranged opposite to the front side of the chip. The back side of the chip may be free of electronic components, i.e., it may consist of the semiconductor material.

The term "property" of a chip may be used herein. For example, the term "property" of a chip may refer to or may include at least one of: a date including at least one of a year, a month, a day, and an hour of the chip's production; a wafer number to identify the wafer out of which the chip has been produced; an information to indicate a type of the chip and/or a type of one or more components included therein; etc. It is noted that the foregoing listing of chip properties is not conclusive. Rather, the term "property" may relate to an arbitrary characteristic related to the chip.

The chips described herein may be included in a chip scale package (CSP). That is, the semiconductor devices described herein may include a CSP. For example, a package may qualify as a CSP when the area of the package is not greater than 1.2 times the area of the die. In addition, it may be a requirement to qualify as a CSP that the CSP corresponds to a single-die, direct surface mountable package. A CSP may, e.g., be a diode or a transistor in a silicon package having a product size smaller than 1 $mm^2$. For such product size, more than 50.000 and even up to 600.000 units may be produced from a single wafer. A CSP may particularly include no solder bumps. An interconnect of the CSP to an application may be provided by flat solder pads without solder depot. A unit size of a small CSP may, e.g., be 1.0 mm×0.6 mm, or 0.6 mm×0.3 mm, or 0.4 mm×0.2 mm.

The semiconductor devices described herein may include an arbitrary number of contact pads, for example solder pads, that may be arranged in an arbitrary geometry depending on the type of the considered semiconductor device. A contact pad may be essentially flat such that the semiconductor device may be mounted directly on a surface of an application, e.g., a Printed Circuit Board (surface mounting). The contact pad may be configured to provide an electrical contact to be made with integrated circuits included in the semiconductor device or a chip included therein.

A contact pad may include one or more metal layers that may be applied to the semiconductor material of the chip. The metal layers may be manufactured with any desired geometric shape and any desired material composition. Any desired metal or metal alloy, for example, aluminum, titanium, gold, silver, copper, palladium, platinum, nickel, chromium, vanadium, tungsten, or molybdenum, may be used as a material. The metal layers need not be homogeneous or manufactured from just one material, i.e., various compositions and concentrations of the materials included in the metal layers may be possible. In one example, the contact pad may correspond to a simple aluminum pad while in a further example the contact pad may correspond to a NiP—Pd—Au layer stack. In the latter case, the contact pad may, e.g., include a layer of NiP having a thickness from about 2 µm (micrometers) to about 4 µm (micrometers), a layer of Pd having a thickness of about 50 nanometers to about 1 µm (micrometer), and a layer of Au having a thickness of about 10 nanometers to about 100 nanometers. It is understood that the named materials and dimensions are exemplary and may be modified depending on the considered semiconductor device or an application using the semiconductor device. Any appropriate technique may be used to manufacture the contact pad or the layers forming the contact pad. For example, an electroless plating process may be employed.

The semiconductor devices described herein may include an identification mark. Such identification mark may, e.g., be required to prevent mixing of different product types, for example during a taping process to ensure that only the correct product type is placed on a carrier tape, or at customer side to ensure that only the correct product type is used during a board assembly process. The identification mark may include an information about a property of a chip including the identification mark. In particular, the identification mark may be arranged over a contact pad of a chip. For example, the identification mark may be arranged in a non-peripheral region over the contact pad. That is, the identification mark may particularly differ from structures arranged at the periphery of the contact pad, for example side walls defining a boundary of the contact pad.

The identification mark may, e.g., include a three-dimensional object. For example, the identification mark may include a first region of the contact pad and a second region of the contact pad, wherein a level of the first region differs from a level of the second region. In one example, different levels of the first region and the second region may have the form of a sharp step. In another example, an intermediate region may be arranged between the first region and the second region, wherein the level of the intermediate region changes from the first region towards the second region.

The identification mark may have a dimension of at least 20 µm (micrometers), more particular of at least 30 µm (micrometers), more particular of at least 40 µm (micrometers), and more particular of at least 50 µm (micrometers). In this regard, the term "dimension" may refer to a maximum extent of the identification mark. When having one of the above-mentioned dimensions, the identification mark may be identified or detected by using usual image data processing tools such that an employment of more complicated tools, e.g., a high performance microscope, may be avoided.

The identification mark may be of arbitrary shape configured to include an information of the chip. For example, the identification mark may include at least one of a letter, a number, a bar code, a shape, and a symbol. It is noted that this listing of possible identification marks is not conclusive and in no way limiting.

The semiconductor devices described herein may include an active area. In particular, the active area may be arranged over the front side of a chip, for example adjacent to a contact pad that may be arranged over the front side of the chip as well. The active area may be defined as the physical part of the device (or a chip included therein) containing microelectronic structures or semiconductor structures. For example, an active area may include at least one semiconductor structure, in particular at least one of a diode, a transistor, a fuse, a transistor, a resistor, a capacitor, etc. Since it may be impossible to exploit an active area one hundred percent, the active area may also include regions not having semiconductor structures. Such areas may, e.g., be referred to as "unused area." Scenarios may occur in which an unused area of the active area may be smaller than an area of an identification mark such that it may be impossible to arrange the identification mark over the active area.

The semiconductor devices described herein may include a dielectric layer that may be fabricated in various ways. For example, the dielectric layer may be deposited from a gas phase or from a solution or it may be laminated onto a considered surface. In addition or alternatively, a thin-film technology or a standard PCB industry process flow may be used for an application of the dielectric layer. The dielectric layer may be manufactured by depositing the dielectric material in a large area, e.g., using a sputtering process, and structuring the deposited dielectric layer afterwards. By way of example, the dielectric layer may be structured by using photolithographic methods and/or etching methods, etc. Due to its structure, the dielectric layer may have regions of different level.

The dielectric layer may have the function of a passivation layer or protection layer. It may define boundaries of a contact pad wherein an area of the contact pad not covered by the dielectric layer may be exposed or uncovered. The dielectric layer may be manufactured from various materials, in particular from at least one of a nitride and an oxide. The dielectric layer may include only one or more layers of dielectric material, for example in form of a layer stack. In one particular example, such layer stack may include a silicon oxide layer having a thickness of about 200 nanometers to about 400 nanometers, and a silicon nitride layer having a thickness of about 700 nanometers to about 900 nanometers.

Semiconductor devices described herein may include a conductive structure, for example having the form of a conductive layer and/or a conductive via structure. In particular, the conductive structure may include one or more metal layers that may be manufactured with any desired geometric shape and/or any desired material composition. Any desired metal, for example aluminum, nickel, palladium, titanium, titanium tungsten, silver, tin, gold, molybdenum, vanadium or copper, or metal alloys may be used for manufacturing the metal layers. The metal layers need not be homogeneous or manufactured from just one material, that is to say various compositions and concentrations of the materials contained in the metal layers may be possible. The conductive structure may provide an electrical connection between a contact pad and an inner electronic structure of a chip on which the conductive structure may be arranged. For example, the conductive layer may be a layer of a metal alloy AlCu having a thickness from about 3 µm (micrometers) to about 4 µm (micrometers).

FIG. 1 schematically illustrates a cross-sectional view of a semiconductor device 100. The semiconductor device 100 includes a chip 1 and a contact pad 2 arranged over the front side 3 of the chip 1. The semiconductor device 100 further includes an identification mark 4 arranged over the contact pad 2, wherein the identification mark 4 includes an information about a property of the chip 1. It is noted that a more detailed semiconductor device similar to the semiconductor device 100 is described in connection with the following figures.

Figure 2A:
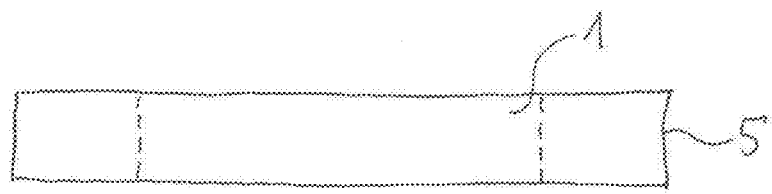
FIGS. 2A to 2B schematically illustrate a cross-sectional view of a method for manufacturing a semiconductor device in accordance with the disclosure.
Figure 2B:
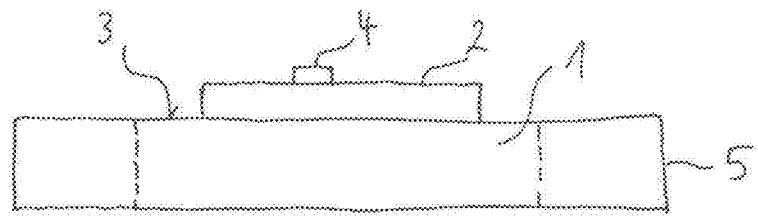

FIGS. 2A and 2B schematically illustrate a method for manufacturing a device. A cross section of a device obtained by the method becomes apparent from FIG. 2B. The obtained device may be similar to the device 100 of FIG. 1. In a first step (see FIG. 2A), a semiconductor wafer 5 including at least one chip 1 (or die) is provided. In a second step (see FIG. 2B), a contact pad 2 is formed over the front side 3 of the chip 1, wherein an identification mark 4 is arranged over the contact pad 2. The identification mark 4 includes an information about a property of the chip 1. It is understood that the described method may include further steps. For example, the semiconductor wafer 5 may be separated into multiple semiconductor device in a further step. It is noted that a more detailed method similar to method 200 is described in connection with FIGS. 3A to 3D.

FIGS. 3A to 3D schematically illustrate a method for manufacturing a semiconductor device in accordance with the disclosure. The produced semiconductor device may be seen as an implementation of the devices described in connection with FIGS. 1, 2A and 2B such that details of the produced device described below may be likewise applied to foregoing devices. In addition, the method shown in FIGS. 3A to 3D may be seen as an implementation of the method illustrated in FIGS. 2A to 2B. Details of the manufacturing method that are described below may therefore be likewise applied to the method of FIGS. 2A to 2B.

Figure 3A:
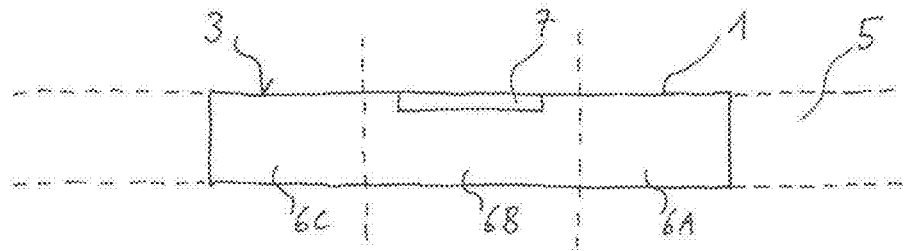
FIGS. 3A to 3D schematically illustrate a cross-sectional view of a method for manufacturing a semiconductor device in accordance with the disclosure.

In FIG. 3A, a semiconductor wafer 5 including one chip (or die) 1 is provided. It is understood that the semiconductor wafer 5 may include further chips which are not illustrated for the sake of simplicity. Further parts of the semiconductor wafer 5 adjacent to the chip 1 are indicated by dashed lines. The chip 1 may include a first region 6A, a second region 6B and a third region 6C. A first contact pad is to be arranged over the first region 6A, an active structure is to be arranged over the second region 6B, and a second contact pad is to be arranged over the second region 6C. It is understood that the arrangement and number of illustrated regions is exemplary and may, e.g., depend on a number and/or arrangement of contact pads and/or active areas that are to be produced for the chip 1. In FIG. 3A, the second region 6B of the semiconductor wafer 5 has already been processed on the front side 3 of the semiconductor wafer 5. For example, doped regions 7 may have been provided that may become a part of an active structure later on.

Figure 3B:
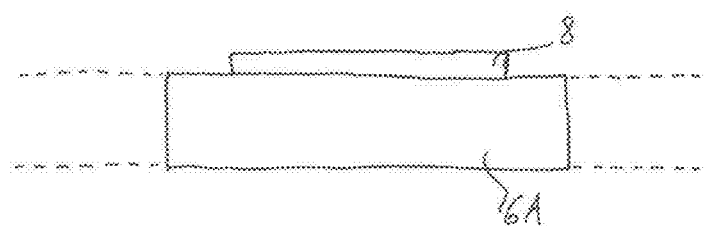
Figure 3C:
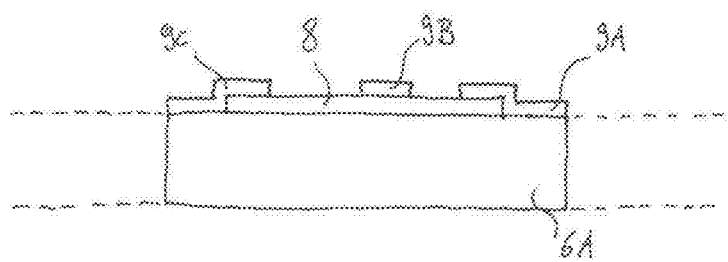
Figure 3D:
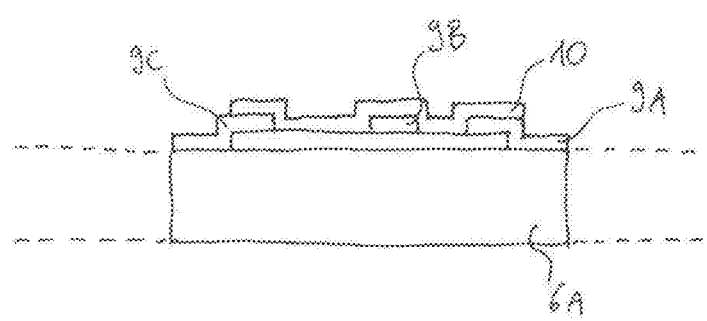

The following FIGS. 3B to 3D illustrate further manufacturing steps for the first region 6A. It is noted that similar manufacturing steps may be applied to the third region 6C. However, for the sake of simplicity only the first region 6A is shown. Further parts of the semiconductor wafer 5 adjacent to the first region 6A are indicated by dashed lines.

In FIG. 3B, a first conductive layer 8 (or a layer stack) is deposited over the first region 6A. In one example, the conductive layer 8 may be a layer of a metal alloy AlCu as described above. The first conductive layer 8 may particularly be configured to provide an electrical connection between an electronic structure of the chip 1 and a contact pad that is to be manufactured over the first region 6A later on. The first conductive layer 8 may thus be referred to as "under pad metallization." The first conductive layer 8 may be formed and structured by any suitable technique. It is noted that the first conductive layer 8 may also be formed and structured over the second region 6B and the third region 6C, respectively. For example, a part of the first conductive layer 8 formed over the second region 6B may become a part of an active structure. In one example, the first conductive layer 8 arranged over the second region 6B may form a part of a finger structure of a diode. In the first region 6A, the first conductive layer 8 may represent a lower layer of a solder pad that is to be formed later on. It is noted that the shape of the first conductive layer 8 as shown in FIG. 3B is exemplary. The first conductive layer 8 may also correspond to a more complex conductive structure including one or more conductive layers and/or one or more conductive via structures.

In FIG. 3C, a structured dielectric layer 9 may be formed over the first region 6A and over the first conductive layer 8. Any suitable technique may be used to form the structured dielectric layer 9. For example, a dielectric material may be deposited over the whole first region 6A (or over the whole first conductive layer 8) and be opened (or structured) in a subsequent manufacturing step. In one example, the structured dielectric layer 9 may correspond to a layer stack including a silicon oxide layer having a thickness of about 200 nanometers to about 400 nanometers, and a silicon nitride layer having a thickness of about 700 nanometers to about 900 nanometers.

The structured dielectric layer 9 may include multiple sections, for example a first section 9A, a second section 9B, and a third section 9C as illustrated in FIG. 3C. The first section 9A and the third section 9C may be arranged at the periphery of the first region 6A of the chip 1 and may at least partly cover peripheral regions of the first conductive layer 8, thereby forming a side wall. The second section 9B of the structured dielectric layer 9 may be arranged in a non-peripheral region of the first region 6A. The second section 9B may particularly have the form of an identification mark that may include an information about a property of the chip 1.

The structured dielectric layer 9 may also be formed over the second region 6B and over the third region 6C, respectively. For example, a part of the structured dielectric layer 9 formed over the second region 6B may become a part of an active structure, for example a part of a finger structure of a diode. In the latter case, parts of the structured dielectric layer 9 arranged over the second region 6B may be used for an electric insulation between fingers of the finger structure.

In FIG. 3D, a second conductive layer (or layer stack) 10 may be formed over the first region 6A, over the first conductive layer 8, and over the structured dielectric layer 9. Any suitable technique may be used to form the second conductive layer 10. For example, an electroless plating process may be used to manufacture the second conductive layer 10. The second conductive layer 10 may, e.g., correspond to a NiP—Pd—Au layer stack as previously described. The second conductive layer 10 may be electrically coupled to the first conductive layer 8.

Even though the second conductive layer 10 may have a substantially constant thickness, it becomes apparent from FIG. 3D that the second conductive layer 10 may be structured due to the structure of the underlying dielectric layer 9. In particular, a height or level of the second conductive layer 10 may be increased at the locations of the sections 9A, 9B, 9C of the structured dielectric layer 9. Since the second section 9B of the structured dielectric layer 9 may have the form of an identification mark (see above), the part of the second conductive layer 10 arranged over the second section 9C of the dielectric layer 9 may have the form of the identification mark as well. Referring back to FIG. 1, the second conductive layer 10 may be identified with the contact pad 2, and the structured part of the second conductive layer 10 arranged over the second section 9B of the structured dielectric layer 9 may be identified with the identification mark 4. The identification mark 4 thus may be based on the structured dielectric layer 9 arranged underneath. It is noted that the second conductive layer 10 may also be formed over the third region 6C of the chip 1 such that an identification mark may be formed over the third region 6C as well.

Providing an identification mark by structuring a contact pad in accordance with the disclosure may result in several advantages compared to other techniques for forming an identification mark. Since the contact pad area may be used for arranging the identification mark, no active area is required to be consumed for the identification mark. This may result in an increase of area that may be used for active structures. In addition, the specified contact pad structuring is inherent in the product design. No additional processes to labeling the semiconductor device may be required, for example backside laser marking processes or backside structuring processes.

It is understood that the method described in connection with FIGS. 3A to 3D may include further steps which are not explicitly illustrated herein. For example, the semiconductor wafer 5 may be separated into multiple semiconductor devices in a further method step.

Figure 4:
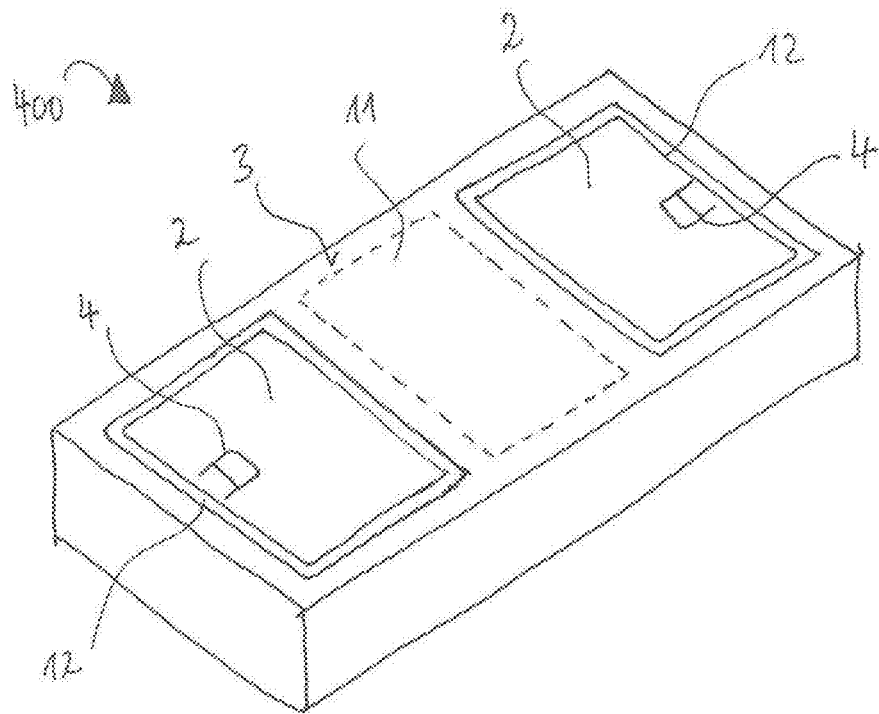
FIG. 4 schematically illustrates an angular view of a semiconductor device 400 in accordance with the disclosure.

FIG. 4 schematically illustrates an angular view of a semiconductor device 400 in accordance with the disclosure. Two contact pads 2 as well as an active area 11 in between are arranged over the front side 3 of the semiconductor device 400. It is noted that the number and arrangement of the contact pads 2 and the active area 11 are exemplary and may particularly depend on the considered type of the semiconductor device 400. Each of the contact pads 2 includes an identification mark 4 having the exemplary form of the letter "A." Regions of the contact pad 4 forming the letter "A" may have an increased height compared to the regions adjacent to the identification mark 4. This may result from an underlying structured dielectric layer as previously described. It is understood that in another example, the heights may also be reversed. That is, the regions of the contact pad 4 forming the letter "A" may have a smaller height compared to the regions adjacent to the identification mark 4. In addition, side walls 12 may be arranged at the periphery of each contact pad 2, wherein each of the side walls may result from the underlying structured dielectric layer as well.

Figure 5:
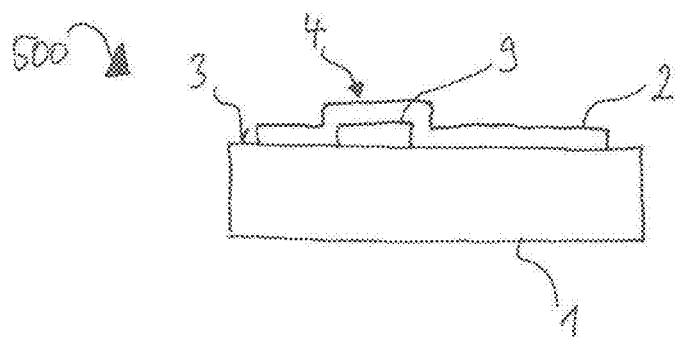
FIG. 5 schematically illustrates a cross-sectional view of a semiconductor device 500 in accordance with the disclosure.

FIG. 5 schematically illustrates a cross-sectional view of a semiconductor device 500 in accordance with the disclosure. The semiconductor device 500 includes a chip 1 and a structured dielectric layer 9 arranged over the front side 3 of the chip 1. The semiconductor device 500 further includes a contact pad 2 arranged over the structured dielectric layer 9, wherein the contact pad 2 includes an identification mark 4. The identification mark 4 is based on the structured dielectric layer 9. The semiconductor device 500 of FIG. 5 is similar to, e.g., the semiconductor device produced by the method of FIGS. 3A to 3D.

While a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific aspects shown and described without departing from the scope of the present invention. This application is intended to cover any adaptations or variations of the specific aspects discussed herein. Therefore, it is intended that this invention be limited only by the claims and the equivalents thereof.

What is claimed is:

1. A semiconductor device, comprising:
   a contact pad arranged over a front side of a chip, and comprising a metallic material, wherein the contact pad comprises a side wall arranged at a periphery of the contact pad, wherein the side wall surrounds a flat surface of the contact pad and the side wall protrudes from the flat surface, wherein the side wall comprises a first surface facing the chip, an exposed second surface facing away from the chip, and an exposed side surface extending from the first surface to the second surface, wherein the side surface is arranged at the periphery of the contact pad and defines a boundary of the contact pad;
   an active area arranged over the front side of the chip and adjacent to the contact pad, wherein the active area comprises an electronic component;
   a conductive structure arranged under the contact pad, wherein the conductive structure forms at least a part of the electronic component;
   a structured dielectric layer arranged under the contact pad, wherein the structured dielectric layer comprises a first section and a second section separated from the first section, wherein the structured dielectric layer forms at least a part of the electronic component, wherein a form of the side wall of the contact pad is similar to a form of the first section of the structured dielectric layer; and
   an identification mark arranged over the contact pad and comprising a same metallic material as the contact pad, wherein the identification mark is separated from the side wall of the contact pad and protrudes from the flat surface of the contact pad, wherein the identification mark comprises information about a property of the chip, and wherein a form of the identification mark is similar to a form of the second section of the structured dielectric layer, wherein the contact pad physically contacts the conductive structure over a substantial area of the contact pad, and wherein the contact pad is separated from the conductive structure by the structured dielectric layer at the side wall of the contact pad and at the identification mark.

2. The semiconductor device of claim 1, wherein the property of the chip comprises a date, a wafer number, and/or a type of the chip.

3. The semiconductor device of claim 1, wherein the identification mark comprises a letter, a number, a bar code, a shape, and/or a symbol.

4. The semiconductor device of claim 1, wherein the identification mark comprises a three-dimensional object.

5. The semiconductor device of claim 1, wherein the identification mark is arranged in a non-peripheral region of the contact pad.

6. The semiconductor device of claim 1, wherein the identification mark comprises a first region of the contact pad and a second region of the contact pad, wherein a level of the first region differs from a level of the second region.

7. The semiconductor device of claim 1, wherein the identification mark has a dimension of at least 20 micrometers.

8. The semiconductor device of claim 1, wherein the contact pad is essentially flat.

9. The semiconductor device of claim 1, wherein the contact pad comprises a solder pad.

10. The semiconductor device of claim 1, wherein the electronic component is selected from the group consisting of a diode, a transistor, and a fuse.

11. The semiconductor device of claim 1, wherein an unused area of the active area is smaller than an area of the identification mark.

12. The semiconductor device of claim 1, wherein the contact pad is electrically coupled to the conductive structure, the conductive structure comprising a conductive layer or a conductive via.

13. The semiconductor device of claim 1, wherein the semiconductor device comprises a chip scale package.

14. A method, comprising:
providing a semiconductor wafer comprising at least one chip;
forming a contact pad over a front side of the chip and comprising a metallic material, wherein the contact pad comprises a side wall arranged at a periphery of the contact pad, wherein the side wall surrounds a flat surface of the contact pad and the side wall protrudes from the flat surface, wherein the side wall comprises a first surface facing the chip, an exposed second surface facing away from the chip, and an exposed side surface extending from the first surface to the second surface, wherein the side surface is arranged at the periphery of the contact pad and defines a boundary of the contact pad;
providing an active area arranged over the front side of the chip and adjacent to the contact pad, wherein the active area comprises an electronic component;
forming a conductive structure arranged under the contact pad, wherein the conductive structure forms at least a part of the electronic component; and
forming a structured dielectric layer arranged under the contact pad, wherein the structured dielectric layer comprises a first section and a second section separated from the first section, wherein the structured dielectric layer forms at least a part of the electronic component, wherein a form of the side wall of the contact pad is similar to a form of the first section of the structured dielectric layer, wherein an identification mark is arranged over the contact pad and comprising a same metallic material as the contact pad, wherein the identification mark is separated from the side wall of the contact pad and protrudes from the flat surface of the contact pad, wherein the identification mark comprises information about a property of the chip, wherein a form of the identification mark is similar to a form of the second section of the structured dielectric layer, wherein the contact pad physically contacts the conductive structure over a substantial area of the contact pad, and wherein the contact pad is separated from the conductive structure by the structured dielectric layer at the side wall of the contact pad and at the identification mark.

15. The method of claim 14, wherein forming a structured dielectric layer comprises:
depositing a dielectric layer over the front side of the chip; and
structuring the dielectric layer.

16. The method of claim 15, wherein forming the contact pad comprises depositing a conductive layer over the structured dielectric layer, wherein the conductive layer comprises the contact pad.

17. The semiconductor device of claim 1, wherein the electronic component comprises a diode, wherein the conductive structure forms a finger structure of the diode, and wherein the structured dielectric layer forms an electric insulation between fingers of the finger structure.

* * * * *